(12) United States Patent
Clemente et al.

(10) Patent No.: US 11,276,615 B2
(45) Date of Patent: Mar. 15, 2022

(54) SEMICONDUCTOR DEVICE PACKAGE WITH A CAP TO SELECTIVELY EXCLUDE CONTACT WITH MOLD COMPOUND

(71) Applicant: Texas Instruments Incorporated, Dallas, TX (US)

(72) Inventors: Laura May Antoinette Dela Paz Clemente, Antipolo (PH); Jerry Gomez Cayabyab, Baguio (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/573,651

(22) Filed: Sep. 17, 2019

(65) Prior Publication Data

US 2020/0013688 A1   Jan. 9, 2020

Related U.S. Application Data

(63) Continuation of application No. 15/980,453, filed on May 15, 2018, now Pat. No. 10,418,294.

(51) Int. Cl.
*H01L 23/495* (2006.01)
*H01L 23/043* (2006.01)
*H01L 23/31* (2006.01)

(52) U.S. Cl.
CPC ........ *H01L 23/043* (2013.01); *H01L 23/3114* (2013.01); *H01L 23/49562* (2013.01)

(58) Field of Classification Search
CPC ............... H01L 23/3114; H01L 23/043; H01L 23/49562
USPC ........................................................ 257/676
See application file for complete search history.

(56) References Cited

U.S. PATENT DOCUMENTS

| | | | |
|---|---|---|---|
| 5,508,231 A | 4/1996 | Ball et al. | |
| 6,492,699 B1* | 12/2002 | Glenn | H01L 27/14618 257/433 |
| 6,970,491 B2 | 11/2005 | Bhandarkar | |
| 7,459,094 B2* | 12/2008 | Shen | C23F 1/02 216/2 |
| 7,858,446 B2* | 12/2010 | Huang | H01L 27/14683 438/116 |
| 8,034,652 B2 | 10/2011 | Nishida et al. | |
| 8,193,024 B2 | 6/2012 | Fujisawa | |
| 8,247,909 B2 | 8/2012 | Zu et al. | |
| 8,766,186 B2* | 7/2014 | Kierse | G01J 1/4228 250/338.1 |
| 9,343,443 B2* | 5/2016 | Tischler | H01L 33/502 |
| 9,472,533 B2* | 10/2016 | Pendse | H01L 24/73 |
| 10,439,587 B2* | 10/2019 | Takano | H03H 3/02 |
| 2007/0187360 A1 | 8/2007 | Shen | |
| 2012/0104421 A1 | 5/2012 | Wai et al. | |
| 2012/0238058 A1 | 9/2012 | Luo et al. | |
| 2014/0027896 A1 | 1/2014 | Yin et al. | |

(Continued)

OTHER PUBLICATIONS

Patent Cooperation Treaty Search Report, PCT Application No. PCT/US 2019/032454, dated Aug. 29, 2019, 2 pages.

*Primary Examiner* — Luan C Thai
(74) *Attorney, Agent, or Firm* — Dawn Jos; Charles A. Brill; Frank D. Cimino

(57) ABSTRACT

A described example includes: a die with an active surface; a cap mounted over a portion of the active surface of the die; and mold compound covering the cap and covering portions of the die, the cap excluding the mold compound from contact with the portion of the active surface of the die.

18 Claims, 7 Drawing Sheets

(56) References Cited

U.S. PATENT DOCUMENTS

2015/0140736 A1    5/2015   Pendse
2018/0083439 A1*   3/2018   Fitzgerald .............. H02H 9/041

* cited by examiner

SEMICONDUCTOR DEVICE PACKAGE WITH A CAP TO SELECTIVELY EXCLUDE CONTACT WITH MOLD COMPOUND

This application is a continuation of U.S. patent application Ser. No. 15/980,453, filed on May 15, 2018, the contents of which are herein incorporated by reference in its entirety.

TECHNICAL FIELD

This disclosure relates generally to semiconductor device packaging, and more particularly to a semiconductor device package with mold compound.

BACKGROUND

Semiconductor devices such as individual integrated circuit (IC) dies are packaged by attaching the individual IC dies to a substrate, and then encapsulating the individual IC dies and portions of the substrate in a mold compound.

The performance of some components on semiconductor devices degrade when the components come into contact with mold compound. For example, the electrical properties of some components on semiconductor devices can be changed by stress due to the mold compound to the extent that the semiconductor device can fail.

Mold compound can be a liquid at room temperature or a solid at room temperature. If a solid at room temperature, the mold compound can be heated to a molten state prior to molding. The mold compound is injected into a mold containing the substrate and a semiconductor device die. After the mold compound cools, the packaged semiconductor device is removed from the mold. During curing and cooling the mold compound shrinks, and as the mold compound shrinks it applies compressive stress to the semiconductor device. The semiconductor device may contain a component with electrical properties that are degraded by compressive stress. Example components on semiconductor devices that are subject to changing electrical properties due to mold compound stress include: a bipolar junction transistor (BJT); an analog transistor; a sensor; and a bulk acoustic wave (BAW) device.

Mold compound used in semiconductor packaging can change electrical properties sufficiently to degrade the performance of the semiconductor device to fail.

SUMMARY

A described example includes: a die with an active surface; a cap mounted over a portion of the active surface of the die; and mold compound covering the cap and covering portions of the die, the cap excluding the mold compound from contact with the portion of the active surface of the die.

DETAILED DESCRIPTION

Corresponding numerals and symbols in the different figures generally refer to corresponding parts unless otherwise indicated. The figures are not necessarily drawn to scale. Elements may be described as "encapsulated" herein. When a package is formed using mold compound, the packaged integrated circuit is referred to as "encapsulated" and the process for molding may be referred to as "encapsulation." As used herein, when a die mounted to a substrate is described as encapsulated, portions of the substrate remain exposed to form leads or terminals for the packaged device, even though it is described as "encapsulated" or it is described as being formed by "encapsulation."

The term "semiconductor device" as used herein means devices formed on a semiconductor substrate. The semiconductor substrate can be a silicon wafer. Additional semiconductor substrate materials useful with the arrangements include other semiconductor wafers, such as gallium arsenide, indium, indium phosphide, gallium phosphide, germanium, and silicon germanium. Silicon on insulator (SOI) substrates, epitaxial semiconductor layers on other materials, such as SiGe layers, and other layers of semiconductor material can be used. The semiconductor devices can be discrete devices such as field effect transistors (FETs), bipolar junction transistors (BJTs), sensors, LEDs, bulk acoustic wave devices (BAW devices), photosensors, and analog devices. In addition the term "semiconductor devices" includes integrated circuit (IC) devices with many hundreds, thousands or more devices integrated to form a single IC. The semiconductor devices are fabricated using semiconductor processes to form multiple identical devices on a substrate, and once processing reaches a certain stage, the identical devices are separated from the substrate into individual semiconductor devices referred to as dies. A die is one of the multiple semiconductor devices formed on the substrate, and the process for separating the individual dies is referred to as "singulation."

Figure 1A:
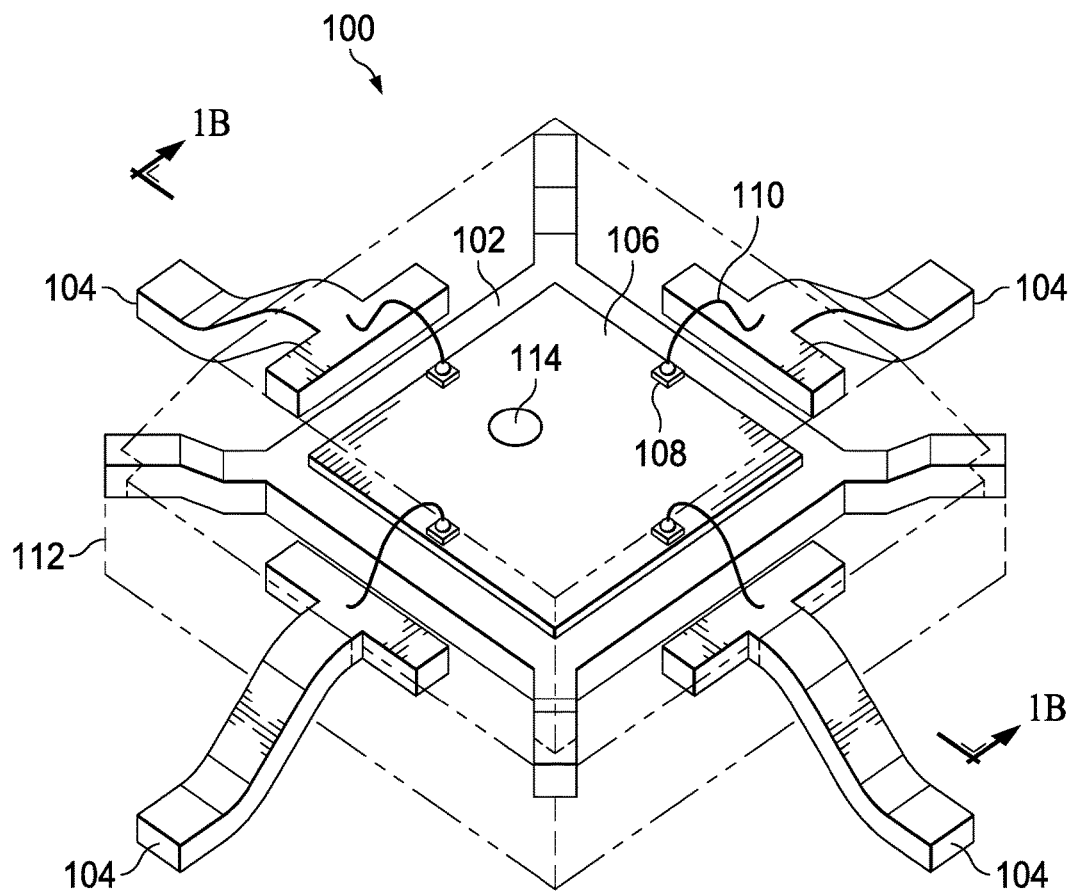
FIGS. 1A and 1B are a projection view and a cross section of a semiconductor device package.

FIG. 1A is a projection view of a semiconductor device package 100. A die 106 is mounted on a die mount pad 102 on a substrate. In this example the substrate is a lead frame 105 (see FIG. 1B). In the arrangements, useful substrates can include: lead frames of copper or other conductive metals (such as Alloy 42); molded interconnect substrates; premolded lead frames with lead frame conductors and mold compound in a preformed structure; tape based and film based substrates carrying conductors; ceramic substrates, laminate substrates with multiple layers of conductors and insulator layers; and printed circuit board substrates of ceramic, fiberglass or resin, or glass reinforced epoxy substrates such as FR4. Useful packaging types include wire bonded and flip chip packages. In wire bonded packages, bond wires couple bond pads on the die to leads on the substrate. The die may be oriented with an active surface facing away from the substrate or "face up" in a cross section with the package terminals oriented at the bottom of the view. In a flip chip package, the semiconductor device is coupled to conductive areas on a substrate using vertical connections such as solder bumps or pillar bumps that are formed on the bond pads on the active surface of the die. The active surface of the die, the surface where devices are formed, is oriented facing the substrate, or "face down" in a cross section oriented with the package terminals at the bottom of the view, which is why the package is referred to as a "flip chip" package. Wire bonded and flip chip packages are useful with the arrangements. Referring again to the example of FIGS. 1A-1B, leads 104 and a die mount pad 102 which are initially connected together, referred to as a lead frame (numbered 105 in FIG. 1B), and provided in a lead frame strip (not shown) prior to assembly, and which are then separated during assembly. In semiconductor device packages useful with the arrangements, both leaded (with the lead frame leads such as 104 extending away from the exterior of a package body formed of mold compound 112 as in FIGS. 1A-1B) and no-lead (see terminals formed of lead portions 704 in FIG. 7A hereinbelow) packages, where portions of the leads form terminals positioned within the area of the package and do not extend away from the package body formed by the mold compound, are formed. The mold compound can be any molding material useful in semiconductor packaging. Useful examples include epoxy, epoxy resin, polyimide, any potting or encapsulation material, and may be a thermoset epoxy resin. The mold compound can include filler particles. The leads can be on one, two or more sides of the finished semiconductor device package to form single, dual or quad type packages. For example, in FIG. 1A a quad leaded package is shown, while in FIGS. 7A-7B a no-lead package is shown. No-lead packages are sometimes referred to as "flat" when the exterior surface of the finished package used for mounting to a system board is a flat surface. An example is a quad flat no-lead (QFN) package which has terminals on four sides. Another useful no-lead package is a small outline no-lead (SON) package which may have terminals on two sides. Leaded package types include single inline pin packages (SIPP, sometimes "SIP" but that term is used for a "system in package" as well, herein "SIP" is used for "system in package") and dual inline packages (DIP).

Returning to FIGS. 1A and 1B, wire bonds 110 electrically connect bond pads 108 on the die 106 to leads 104 on the lead frame 105. The die 106 contains a portion 114 on the active surface, which is the upper surface of die 106 as oriented in FIGS. 1A-1B. A component that can potentially be degraded by mold compound stress can be located within the portion 114. Examples include a bulk acoustic wave (BAW) component. The die mount pad 102, the die 106, the bond pads 108, the wire bonds 110, and a portion of the leads 104 are encapsulated with mold compound 112. Note that in the example arrangement of FIGS. 1A-1B, the portions of the leads 104 extending away from the mold compound 112 are not covered in mold compound, even though the term "encapsulated" is used to describe the arrangement; instead, these uncovered portions of leads 104 form external leads or terminals for the finished package 100. As used herein the term "encapsulated" means that portions of the die and a portion of the substrate are covered in mold compound. Another portion of the substrate, sometimes including protruding leads or leads formed on surfaces of the substrate, is not covered by the mold compound, even when the device is referred to as "encapsulated." The leads 104 allow both electrical connection and mechanical attachment to the package 100. For example, the leads 104 may later be surface mounted to a system circuit board (not shown).

Figure 1B:
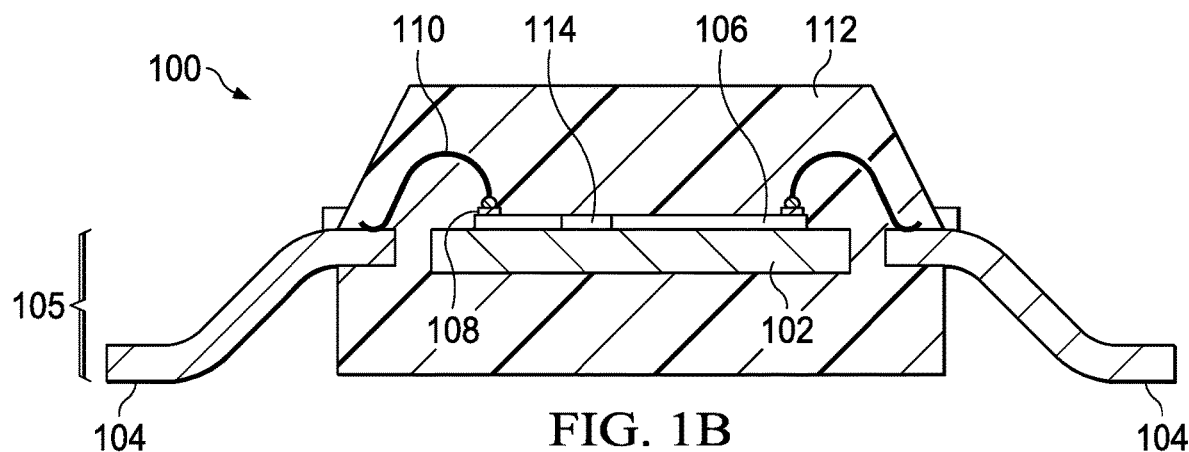

FIG. 1B shows a cross section taken along dashed line 1B-1B through the semiconductor device package 100 shown in FIG. 1A. Mold compound 112 directly contacts the active surface of the die 106 and directly contacts the portion 114 on the die 106. When the portion 114 includes a component that may have performance degradation when subjected to mold compound stress, that component is also in physical contact with the mold compound 112.

Mold compounds useful for semiconductor packaging can have a flexural modulus in the range of about 20,000 to 50,000 Mega Pascals (MPa). Stress of this magnitude can change electrical properties of certain components formed on a die sufficiently to degrade the performance of the die 106 or cause the die 106 to fail. Examples of components that may have performance degradation due to mold compound stress include bipolar junction transistors (BJT), analog circuits, and bulk acoustic wave (BAW) devices. For certain semiconductor devices that include these types of components, degradation in device performance due to mold compound stress can cause a failure in the semiconductor device.

Figure 2A:
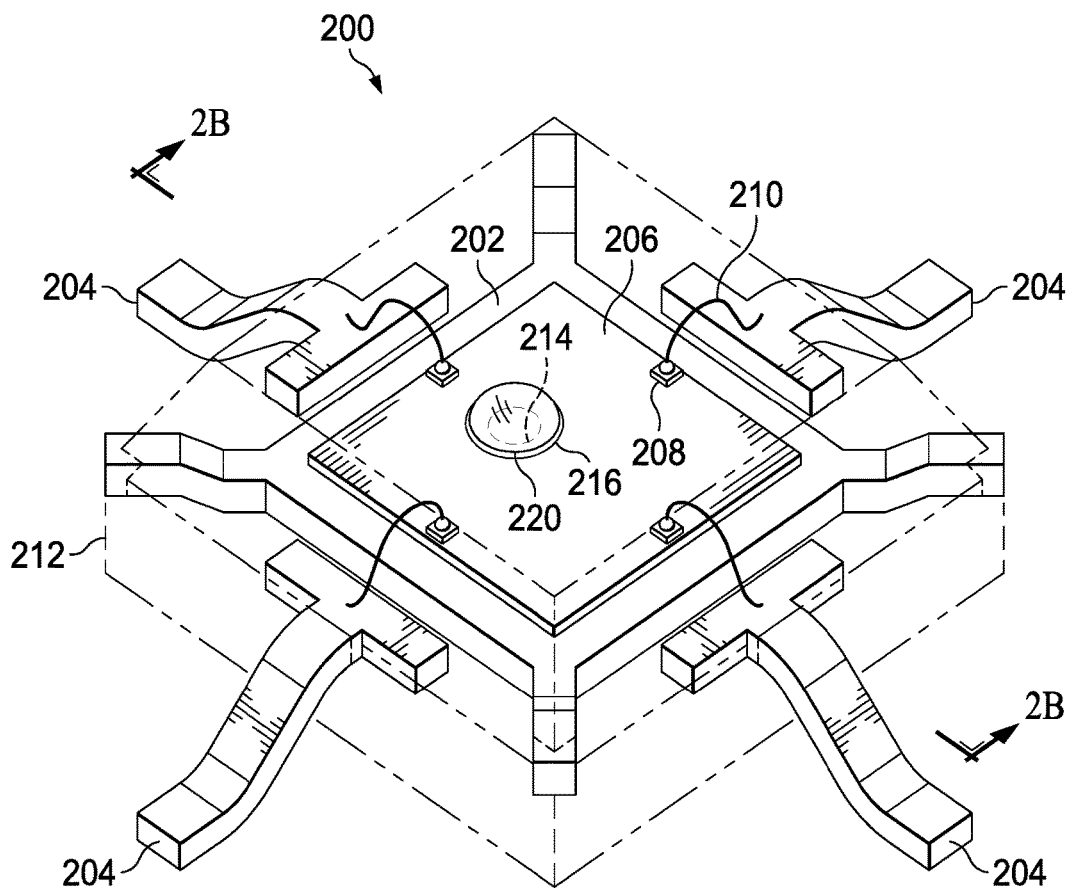
FIGS. 2A and 2B are a projection view and a cross section of a semiconductor device package with a cap.

FIG. 2A shows a perspective view of a semiconductor device package 200 with a cap 220. In FIG. 2A, similar reference labels are used for similar elements shown in FIG. 1A, for clarity. For example, die 206 in FIG. 2A corresponds to die 106 in FIG. 1A. The die 206 is mounted on a die mount pad 202 that is a portion of a lead frame 205. Wire bonds 210 electrically connect bond pads 208 on the die 206 to leads 204 on lead frame 205 (shown in FIG. 2B). The die 206 contains a portion 214 on the active surface of die 206 that is to be protected by the cap 220. The portion 214 can include a component such as a BAW, BJT, or an analog transistor that changes performance due to mold compound stress. The die mount pad 202, the die 206, bond pads 208, the wire bonds 210, and a portion of the leads 204 on the lead frame 205 are covered with mold compound 212. The cap 220 covers the portion 214 on the active surface of die 206. The cap 220 is bonded to the surface of the die 206 with an adhesive 216 such as an epoxy or an acrylated urethane. An air pocket 217 (see FIG. 2B) is formed between the mold compound 212 and the portion 214 beneath cap 220. Stress from the mold compound 212 that is applied to the surface of the cap 220 is blocked from being transmitted to the portion 214 by the air pocket 217 that forms between the underside of the cap 220 and the portion 214 on the active surface of die 206. Portion 214 of the die 206 is excluded from contact with the mold compound 212 by the cap 220.

Figure 2B:
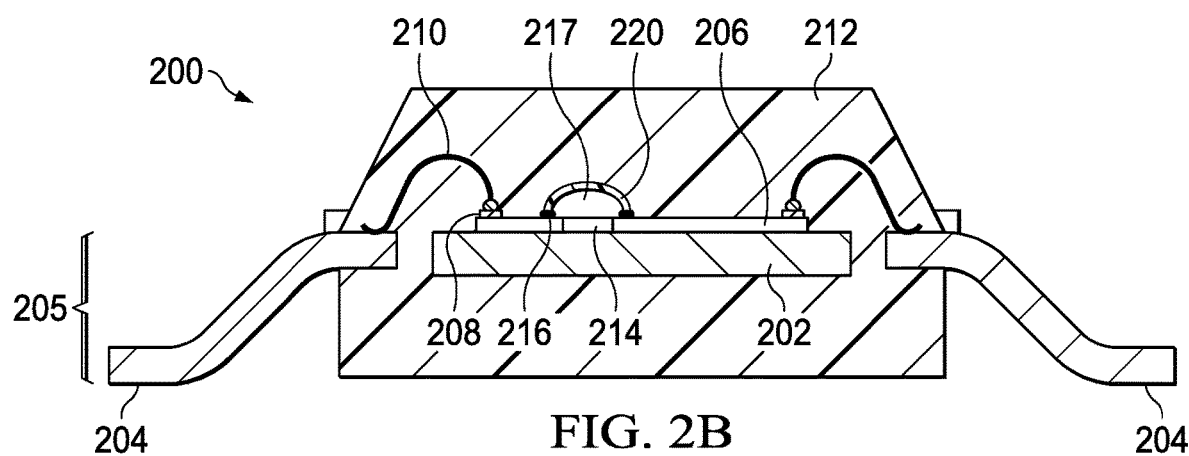

FIG. 2B shows a cross section taken along dashed line 2B-2B taken through 200 shown in FIG. 2A. Mold compound 212 is excluded from contacting the portion 214 on the die 206 by the cap 220. The term "cap" means a protective cover for an object. As used herein the term cap includes a cover having a base that, when mounted to a surface, surrounds a portion of the surface the cap is mounted to, and having an exterior surface extending from the base that forms a volume within the cap. The cap 220 is positioned over the portion 214 on the active surface of die 206. Using an adhesive 216 such as epoxy or acrylated urethane, the base of the protective cap 220 is bonded to the surface of the die 206. The adhesive can be any non-conductive adhesive and in examples the adhesive can be applied as a paste or gel by dispensing, printing, dipping operations. The protective cap 220 surrounds the portion 214 which can include a mold compound sensitive component. The air pocket 217 that forms under the protective cap 220 and over the portion 214 excludes the mold compound from contacting the portion 214. Use of the protective cap 220 blocks the mold compound 212 from changing the electrical performance of components in portion 214 of the die 206.

The cap 220 can be composed of any material with sufficient rigidity to prevent the mold compound 212 from coming into contact with the portion 214. Preferably the cap 220 is composed of a non-conductive material such as glass, plastic, or ceramic. In some applications the cap 220 can be metal. Various shapes such as a hemisphere, a hemispherical oval, or a box shape can be used. When protective cap 220 is bonded to the die 206, an air pocket 217 forms between the mold compound 212 and the active surface of the die 206 in portion 214, excluding the mold compound from contacting the portion 214. The use of protective cap 220 also prevents or reduces the transmission of stress from the mold compound 212 to components that are formed in the portion 214 of the die 206.

Figure 3A:
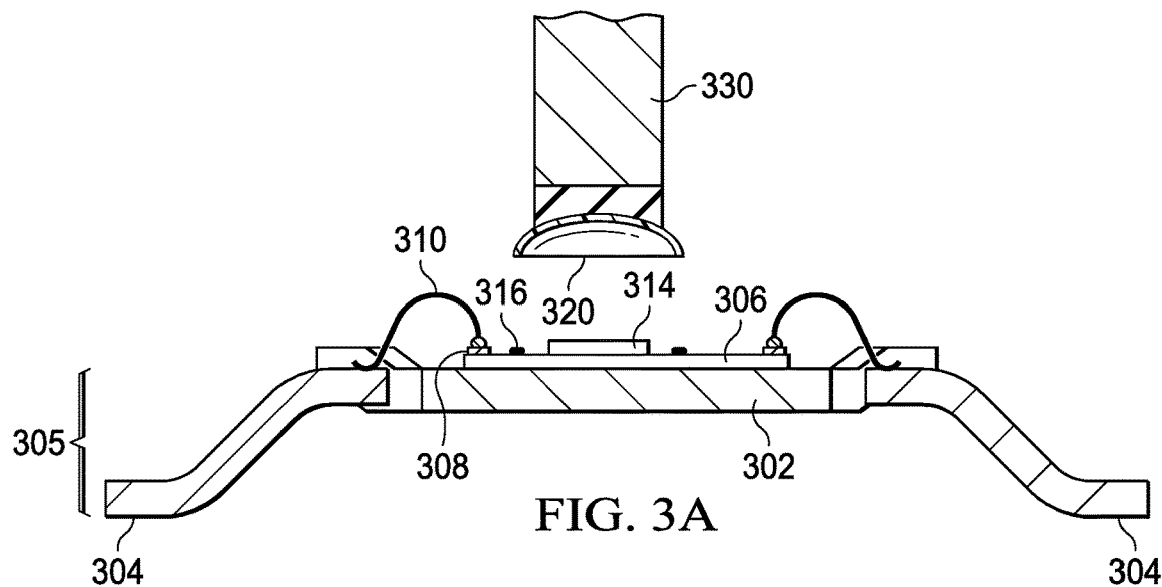
FIGS. 3A through 3C are cross sections illustrating steps in a method for excluding mold compound from contacting selected portions of an integrated circuit die in a semiconductor device package.
Figure 3B:
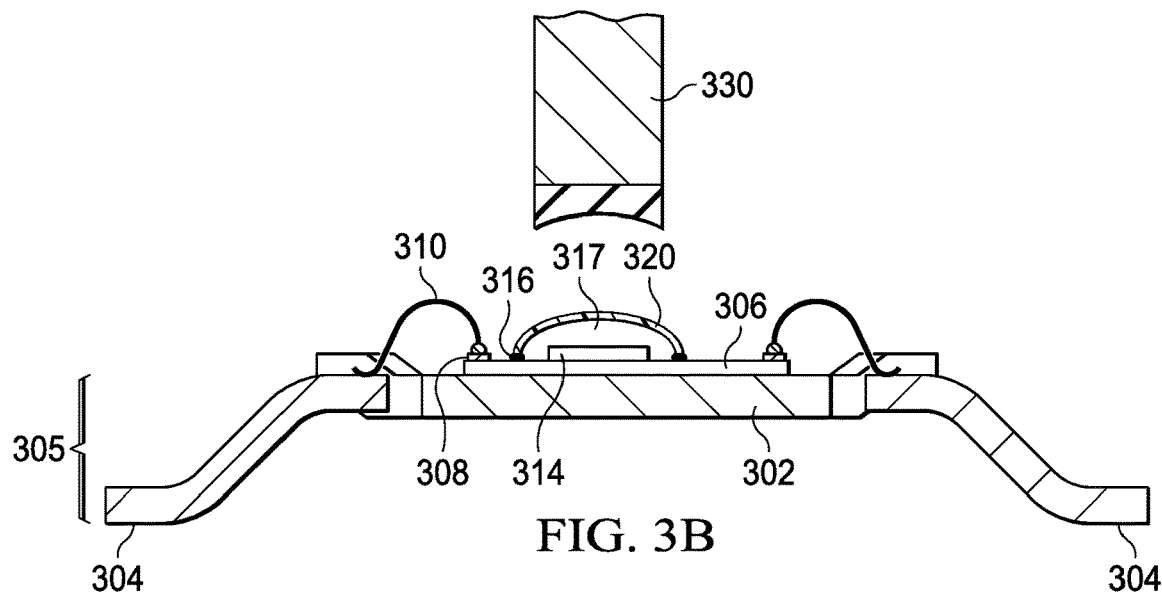
Figure 3C:
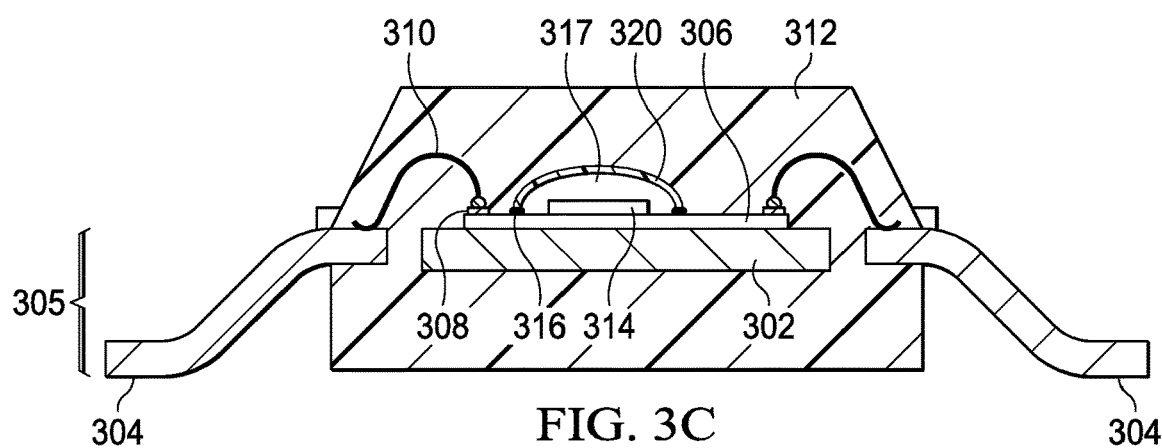
Figure 4:
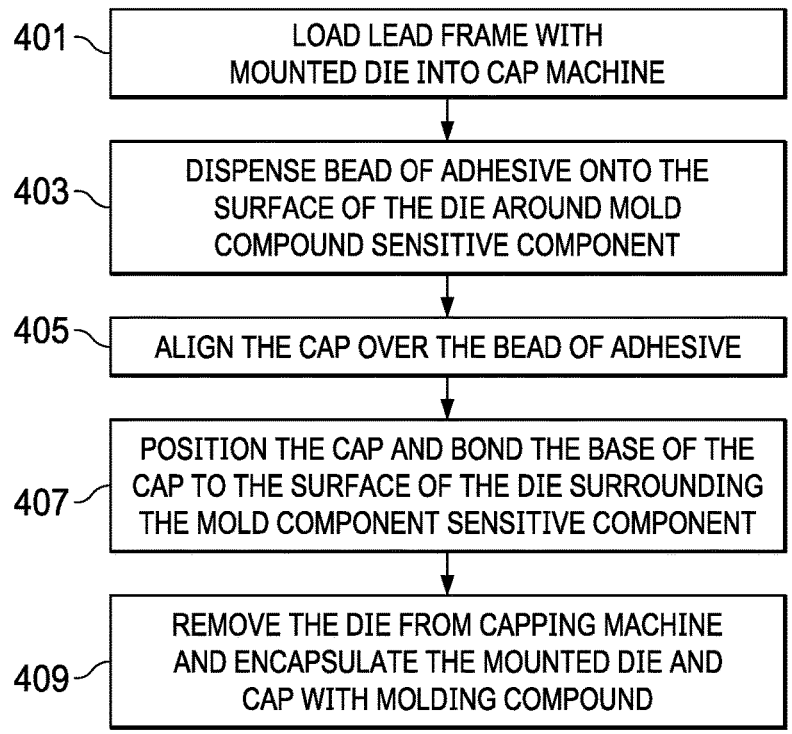
FIG. 4 is a flow diagram of an example method for protecting a portion of an integrated circuit die from contact with mold compound in a semiconductor device package.

FIGS. 3A-3C and the flow diagram in FIG. 4 illustrate one example method for attaching the cap 320 over a portion 314 of the die 306. In FIG. 3A, similar reference labels are used for similar elements shown in FIG. 1A, for clarity. For example, die 306 in FIG. 3A corresponds to die 106 in FIG. 1A.

In step 401 in FIG. 4, a die 306 (see FIG. 3A) with a component 314 (such as a BAW device) on an active surface of die 306 is placed into a capping tool. As oriented in FIGS. 3A-3C, the active surface is the upper surface of die 306. Note that in FIGS. 3A-3C, the component 314 is shown as a separate device or die from the die 206, but 314 can also be a portion of the die 306 as shown in FIGS. 2A-2B.

In the cross section in FIG. 3A, a die 306 is mounted on the die mount pad 302 of a lead frame 305 with the active surface facing away from the lead frame 305, that is, in a face up orientation. Bond wires 310 electrically connect bond pads 308 on the die 306 to leads 304 on the lead frame 305. In this arrangement BAW device is used for illustration as component 314. The component 314 is either formed as part of the die 306 (as shown for 214 in FIGS. 2A-2B) or is mounted on the surface of the die 306, as shown in FIGS. 3A-3C. If 314 is formed on a second die, a die stacking arrangement forms a system in package (SIP) device (see another example in FIG. 7A, described hereinbelow). Since the BAW device includes structures quite different from semiconductor components such as planar transistors, a processor IC or other die 306 can have a component 314 such as a second, separate BAW die mounted on the active surface of 306. Wire bonds can connect signals between the two dies to form a system. When packaged as a single integrated device, this arrangement is sometimes referred to as a system in package (SIP), a system on an integrated circuit (SOIC), or a system on a chip (SOC) device. In another alternative shown in FIG. 7A and described hereinbelow, a SIP package uses a flip chip arrangement to couple the component 714 to a die 706.

In step 403 illustrated in FIG. 3A, bead 316 of an adhesive such as an epoxy or an acrylated urethane is dispensed onto the surface of the die 306 surrounding component 314. Other adhesives compatible with semiconductor materials and mold compounds can be used.

In step 405 in FIG. 4 and as shown in the cross section in FIG. 3A, a cap placement tool 330 positions the cap 320 over the die 306 and aligns it to the bead 316 of adhesive.

In step 407 in FIG. 4 and as shown in the cross section in FIG. 3B the cap placement tool 330 positions cap 320 over the component 314, and the base of the cap 320 makes contact to the bead 316 of adhesive on the active surface of the die 306 surrounding component 314. The capping tool 330 then releases the cap 320 and withdraws. An air pocket 317 forms under the cap 320 and excludes mold compound 312 from contacting the component 314. Because the mold compound 312 is excluded from contact with component 314 by the cap 320 and the air pocket 317, use of the arrangements reduces or prevents the mold compound 312 from altering the properties of component 314.

Light emitting diode (LED) lens placement tools are used in packaging to bond a glass LED lens over the LED in a packaged LED device. In one example method, the cap placement tool 330 can be a LED lens placement tool and a LED lens can be the cap 320. Other tools and other cap materials can also be used to form additional methods.

In step 409 and illustrated in the cross section in FIG. 3C, the mounted die 306 with the bonded cap 320 is removed from the cap placement tool 330 and is encapsulated with mold compound 312. The cap 320 excludes mold compound 312 from contacting component 314. Excluding the mold compound from contacting the component 314 prevents the mold compound 312 from degrading the electrical properties of component 314, which can result in reduced performance and/or failure of the die 306.

Figure 5A:
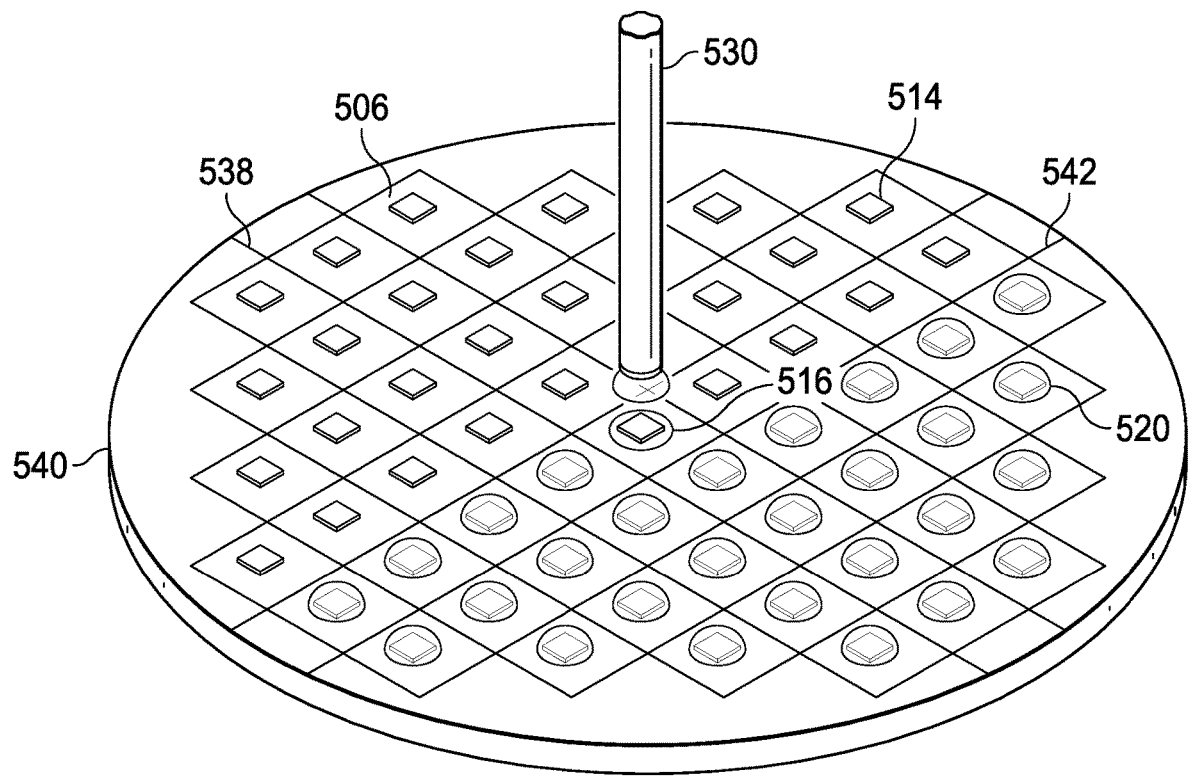
FIGS. 5A through 5D are cross sectional views that illustrate steps in another example method for protecting a portion of an integrated circuit die from contact with mold compound in a package.
Figure 5B:
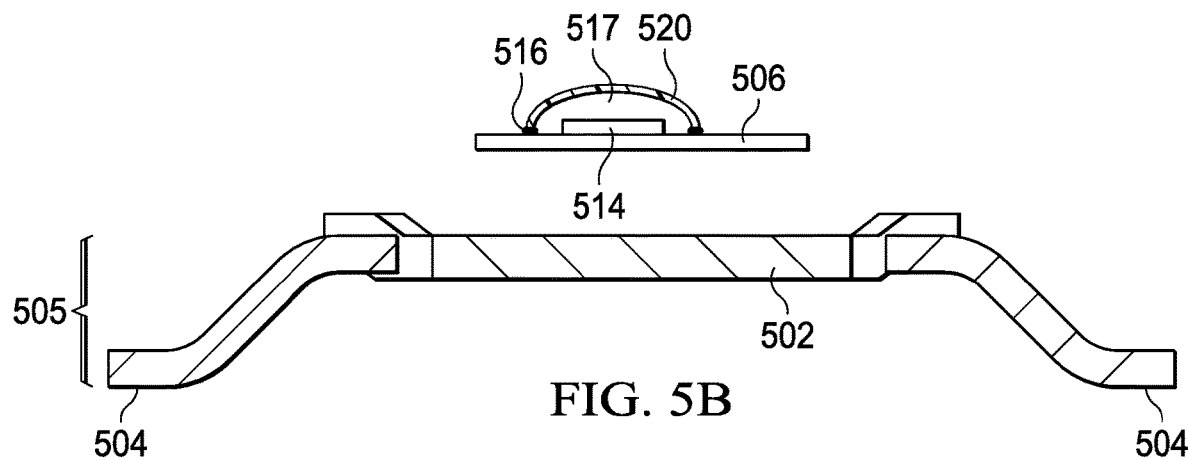
Figure 5C:
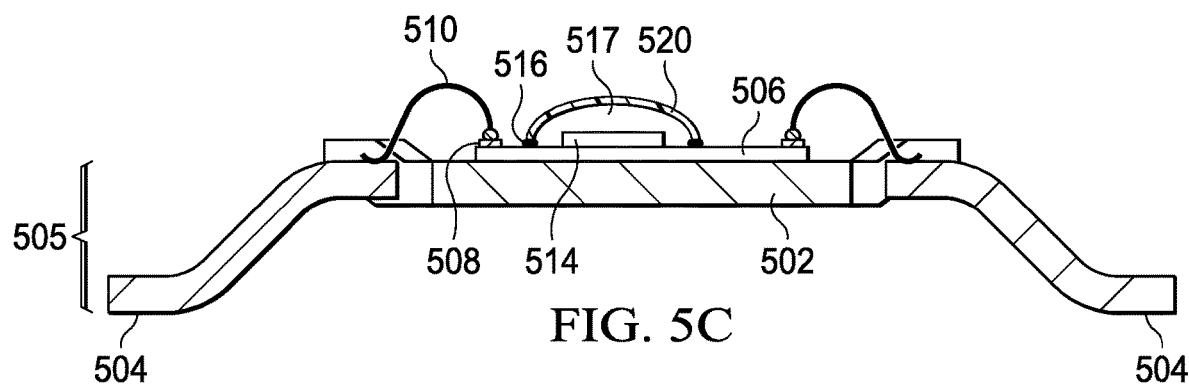
Figure 5D:
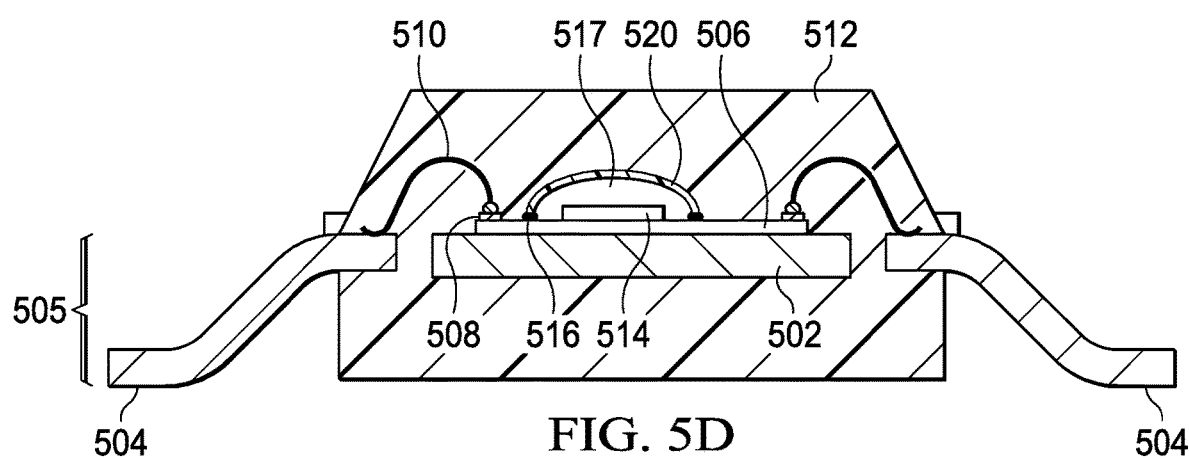
Figure 6:
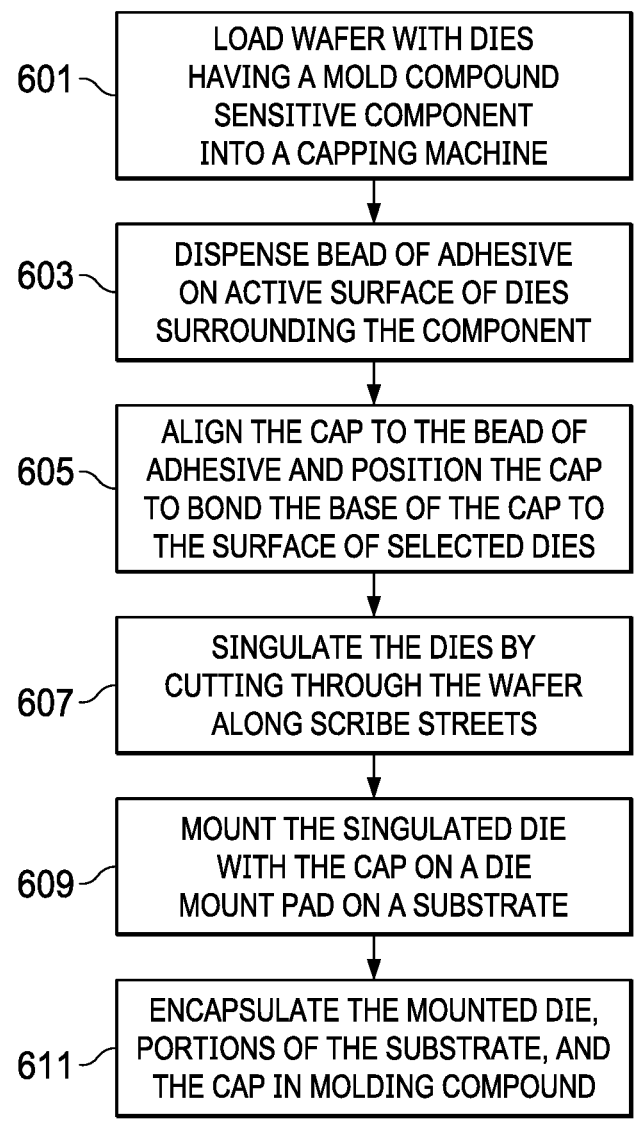
FIG. 6 is a flow diagram of an example method for protecting a portion of an integrated circuit die from contact with mold compound in a package.

FIGS. 5A-5D and the flow diagram in FIG. 6 illustrate another example method for excluding mold compound from contact with a selected portion of an semiconductor device die or form contacting a separate component attached to the semiconductor device die. In FIG. 5A, similar reference labels are used for similar elements shown in FIG. 1A, for clarity. For example, dies 506 in FIG. 5A correspond to die 106 in FIG. 1A. Note that while the drawings show component 514 as a separate device mounted on die 506 in FIGS. 5A-5D, the component 514 can also be a portion of the active surface of die 506, as shown by portion 214 in FIGS. 2A-2B.

FIG. 5A shows the dies 506 with the component 514 (a BAW is used for illustration) in semiconductor wafer 540 form prior to singulation. The wafer 540 is oriented so that the active surfaces of dies 506 and the components 514 are facing up as shown in FIG. 5A.

In step 601 of the flow diagram in FIG. 6 the semiconductor wafer 540 (FIG. 5A) with dies 506 having a component 514 is loaded into a cap placement tool 530. In step 603 a bead 516 of an adhesive such as an epoxy or an acrylated urethane is dispensed on the surface of the die 506 surrounding the component 514.

In step 605 of the flow diagram in FIG. 6 the cap placement tool 530 aligns the cap 520 to the bead 516 of adhesive, as shown in FIG. 5A. The adhesive 516 bonds the base of the protective cap to the active surface of the IC die 506, surrounding the component 514 to be excluded from contact with mold compound as shown in FIG. 5B. A protective cap 520 is bonded over the components 514 on the good dies selected from dies 506 on the semiconductor wafer 540. A "good die" is a die that has been electrically tested and meets target specifications. Protective caps 520 are not needed on dies 506 that have been tested and failed the tests, as these devices will not be packaged to avoid wasted material.

In step 607, after covering component 514 on the good dies on the semiconductor wafer 540 with a protective cap 520, the dies 506 are singulated by sawing or laser cutting through the semiconductor wafer 540 along the scribe streets 538 and along intersecting scribe streets 542 between the dies 506, the scribe streets are shown FIG. 5A.

In step 609 and illustrated in the cross sections in FIGS. 5B and 5C, the singulated dies 506 with the protective cap 520 covering component 514 are mounted on the die mount pad 502 on a substrate, here a lead frame 505. FIG. 5B shows a die 506 with the protective cap 520 positioned above the die mount pad 502. FIG. 5C shows the singulated die 506 with the protective cap 520 after it is mounted on the die mount pad 502 and electrically connected to leads 504 on the lead frame with wire bonds 510 coupled to bond pads 508 on die 506.

In step 611 and illustrated in FIG. 5D the die 506 with the protective cap 520 over the component 514, the die mount pad 502 on lead frame 505, and the wire bonds 510 are encapsulated with mold compound 512. Portions of the leads 504 are covered with mold compound 512, while other portions are uncovered. Protective cap 520 excludes the mold compound 512 from contacting component 514. The air pocket 517 that forms between the underside of the protective cap 520 and the upper surface of the component 514 excludes the mold compound 512 from coming into contact with and from changing the electrical performance of the component 514.

Figure 7A:
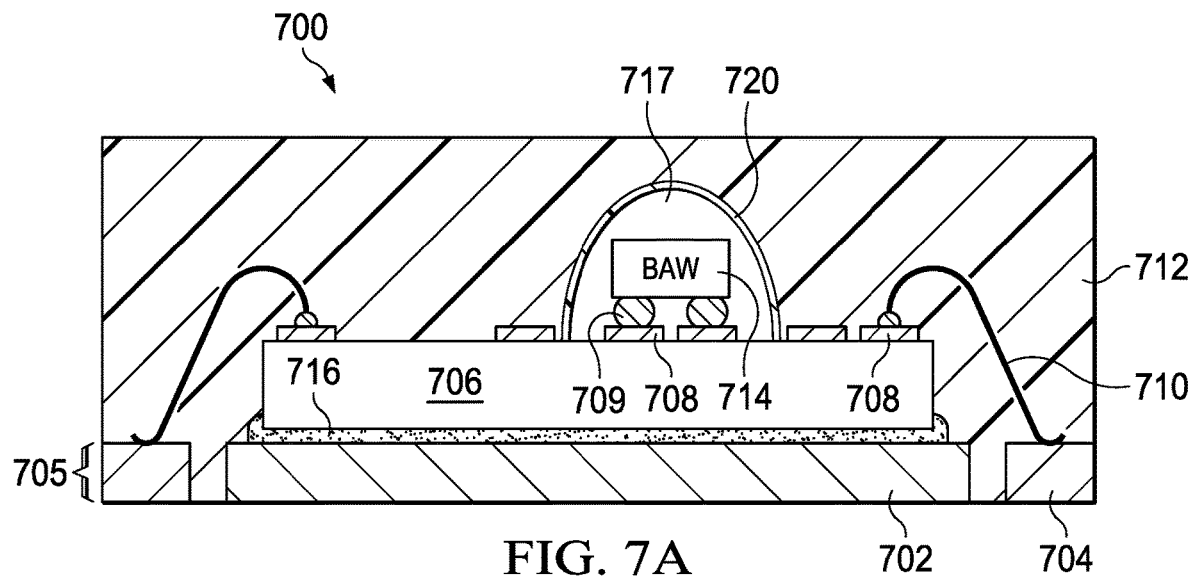
FIGS. 7A-7B are a cross sectional view and a projection of another semiconductor device package with a cap.
Figure 7B:
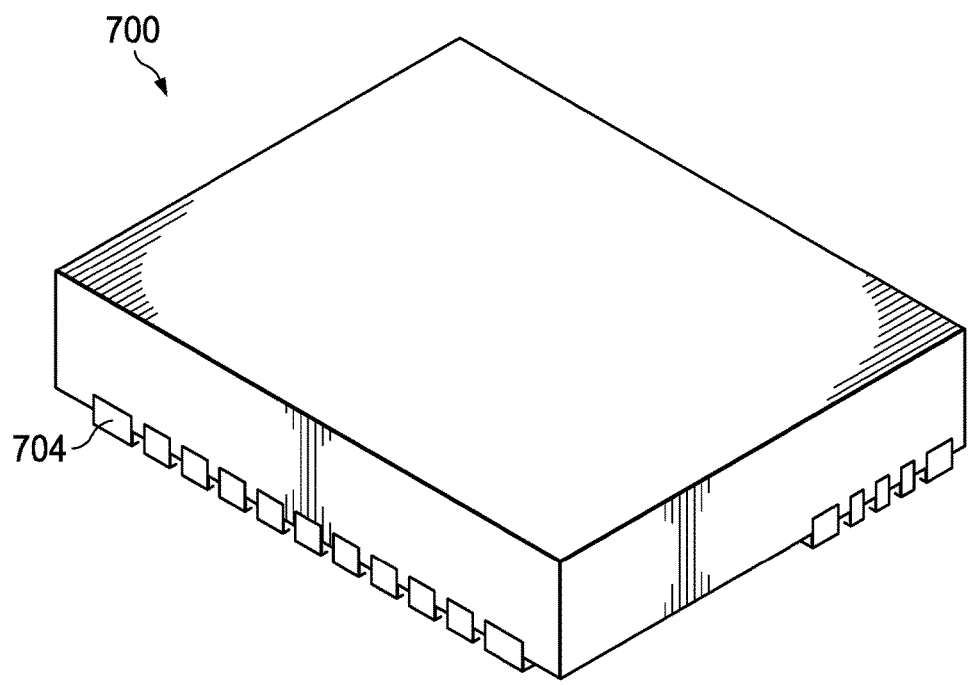

FIGS. 7A-7B illustrate in a cross section and a projection view respectively an arrangement for a no-lead package such as a quad flat no-lead (QFN) package 700. In FIG. 7A similar reference labels are used for similar elements shown in FIG. 1A, for clarity. For example, die 706 in FIG. 7A corresponds to die 106 in FIG. 1A. FIG. 7A shows a stacked die configuration with a semiconductor device die 706, which can be a controller IC, for example, having a second component 714, for example a BAW device, stacked thereon in a flip chip arrangement. In an example the second component 714 is a type of component that may have degraded performance due to stress from a mold compound. The cap will exclude the second component 714 from contact with the mold compound. BAW devices are an example component that are known to have degraded performance due to mold compound stress, other examples include BJT transistors and certain analog transistors. The second component 714 is bonded to the active surface of the die 706, which is the upper surface as shown in FIG. 7A. Die attach layer 716 attaches die 706 to a die mount pad 702 of a substrate, in this example a lead frame 705. In an example, lead frame 705 is a copper lead frame. In an alternative arrangement, lead frame 705 is a conductive metal or a conductive metal alloy, for example, Alloy 42. Leads 704 are connected to bond pads 708 on die 706 by bond wires 710. In an alternative arrangement (not shown), die 706 can be flip chip mounted onto 702. In the example shown the second component 714 is flip chip mounted to die 706 using solder balls or pillar bumps 709 bonded to bond pads 708. The flip chip connections allow communication and electrical connection between the die 706 and second component 714. A protective cap 720 covers the second component 714. An air pocket 717 forms between the protective cap 720 and the second component 714. Mold compound 712 covers at least a portion of the die 706, the protective cap 720, the bond wires 710, and portions of leads 704. As can be seen in the projection view of FIG. 7B, some portions of the leads 704 in a no-lead package are not covered by mold compound 712 but remain uncovered forming terminals for making electrical contact to the semiconductor device package 700. The package 700 can be surface mounted to a system board, for example, with the leads 704 making electrical connections, and die mount pad 702 making a thermal connection to a heat sink or other thermal path. In some arrangements die mount pad 702 is also used as a ground connection. In FIG. 7B a projection view of the semiconductor device package 700 illustrates the completed package with leads 704.

Placing a cap over a portion of a semiconductor device die prior to covering the die during molding prevents mold compound from contacting the portion of the die. Use of the cap reduces or eliminates detrimental effects mold compound can cause to the portion of the die which can include a component. Preventing the mold compound from reaching certain types of components which have performance degradation when exposed to the mold compound increases device yield by reducing or avoiding semiconductor device failures and increases yield by avoiding component performance degradation.

Modifications are possible in the described arrangements, and other alternative arrangements are possible within the scope of the claims.

What is claimed is:

1. An apparatus, comprising:
   a die with an active surface;
   a glass over a portion of the active surface of the die, the portion of the die including a bulk acoustic wave (BAW) device mounted on the active surface; and
   mold compound directly contacting a surface of the glass and covering portions of the die, the glass excluding the mold compound from contact with the portion of the active surface of the die.

2. The apparatus of claim 1, and further comprising an air pocket between the glass and the portion of the active surface of the die.

3. The apparatus of claim 1, wherein the glass includes a hemispherical shape.

4. The apparatus of claim 1, wherein a base of the glass is bonded to a surface of the die with an adhesive, the glass covering a component formed in the portion of the active surface of the die.

5. The apparatus of claim 4, wherein the adhesive is one selected from a group consisting essentially of: epoxy and acrylated urethane.

6. The apparatus of claim 1, further comprising a substrate with a die mount pad, the die mounted to the die mount pad, and electrical connections coupling leads on the substrate to bond pads on the die.

7. The apparatus of claim 6, wherein the substrate is a portion of a lead frame including the die mount pad and the leads, and portions of the lead frame and the leads are covered in the mold compound.

8. The apparatus of claim 1, wherein the apparatus is one selected from a group consisting essentially of: a no-lead package, a single inline pin package, a dual inline package, a quad flat no-lead package, a small outline no-lead package, and a system in a package.

9. The apparatus of claim 1 wherein the die is a discrete semiconductor device.

10. The apparatus of claim 1, wherein the die is an integrated circuit.

11. The apparatus of claim 1, wherein the die is a first integrated circuit die, and the portion of the active surface further comprises a second integrated circuit die mounted to the portion of the active surface of the first integrated circuit die.

12. The apparatus of claim 1, wherein the apparatus is a quad flat no-leads (QFN) package.

13. The QFN package of claim 12, further comprising an air pocket between the glass and the BAW device the glass and the air pocket excluding the mold compound from contact with the BAW device.

14. The QFN package of claim 12, wherein the BAW device is electrically connected to the die via conductive bumps.

15. The QFN package of claim 12, wherein the glass includes one of a hemispherical shape and hemispherical oval shape.

16. The QFN package of claim 12, and further comprising:
   a substrate having a die mount portion, the die attached to the die mount portion; and
   the substrate having conductive leads, the conductive leads electrically connected to the die.

17. The apparatus of claim 1, and further comprising:
   a substrate having a die mount portion, the die attached to the die mount portion; and
   the substrate having conductive leads, the conductive leads electrically connected to the die.

18. The apparatus of claim 17, wherein a portion of the substrate and a first portion of the leads are covered in the mold compound, while a second portion of the leads are not covered in mold compound and extend away from the mold compound to form terminals of a leaded package.

\* \* \* \* \*